US007058881B2

(12) United States Patent
Chu

(10) Patent No.: US 7,058,881 B2
(45) Date of Patent: Jun. 6, 2006

(54) DISTRIBUTED 4-BITS DIAGONAL INTERLEAVED PARITY (DIP4) CHECKER

(75) Inventor: Ngok Ying Chu, San Jose, CA (US)

(73) Assignee: Broadcom Corporation, Irvine, CA (US)

( * ) Notice: Subject to any disclaimer, the term of this patent is extended or adjusted under 35 U.S.C. 154(b) by 439 days.

(21) Appl. No.: 10/234,165

(22) Filed: Sep. 5, 2002

(65) Prior Publication Data

US 2003/0182613 A1 Sep. 25, 2003

Related U.S. Application Data

(60) Provisional application No. 60/364,051, filed on Mar. 15, 2002.

(51) Int. Cl.
H03M 13/09 (2006.01)
(52) U.S. Cl. ..................................................... 714/807
(58) Field of Classification Search ................ 714/807, 714/758, 775, 781, 798
See application file for complete search history.

(56) References Cited

U.S. PATENT DOCUMENTS

| 5,367,544 A | * | 11/1994 | Bruekheimer ................ 375/368 |
| 5,479,416 A | | 12/1995 | Snodgrass et al. ......... 371/37.1 |
| 5,636,208 A | | 6/1997 | Chang et al. ................ 370/347 |
| 5,751,745 A | | 5/1998 | Chen et al. ................. 371/51.1 |
| 5,771,249 A | * | 6/1998 | Yanagisawa ................. 714/798 |
| 5,923,653 A | | 7/1999 | Denton ....................... 370/375 |

OTHER PUBLICATIONS

"Pos-Phy Level 4, A Saturn Packet and Cell Interface Specification for OC192 Sonet/SDH and 10 Gigabit Ethernet", Interface Specification, PMC-Sierra, Inc., Nr. 6, pp. 1-49, XP002247175, Feb. 2001.

* cited by examiner

*Primary Examiner*—Stephen M. Baker
(74) *Attorney, Agent, or Firm*—Squire, Sanders & Dempsey L.L.P.

(57) ABSTRACT

A logic circuit includes an interface and an error detection unit. The interface is configured to receive and transmit a data stream, wherein the data stream includes at least one of a variable length format packet or burst and a fixed length format packet or burst. The error detection unit is configured to detect an error detection code error when a misalignment occurs within the data stream by recursively calculating parity terms.

20 Claims, 15 Drawing Sheets

| Bit Position | Label | Description |
|---|---|---|
| 15 | Type | Control Word Type.<br><br>Set to either of the following values:<br>1: payload control word (payload transfer will immediately follow the control word).<br>0: idle or training control word (otherwise). |
| 14:13 | EOPS | End-of-Packet (EOP) Status.<br><br>Set to the following values below according to the status of the immediately preceding payload transfer.<br><br>0 0: Not an EOP.<br>0 1: EOP Abort (application-specific error condition).<br>1 0: EOP Normal termination, 2 bytes valid.<br>1 1: EOP Normal termination, 1 byte valid.<br><br>EOPS is valid in the first control word following a burst transfer. It is ignored and set to "0 0" otherwise. |
| 12 | SOP | Start-of-Packet<br><br>Set to 1 if the payload transfer immediately following the control word corresponds to the start of a packet. Set to 0 otherwise.<br><br>Set to 0 in all idle and training control words |
| 11:4 | ADR | Port Address.<br><br>8-bit port address of the payload data transfer immediately following the control word. None of the addresses are reserved (all are available for payload transfer).<br>Set all to zeroes in all idle control words.<br>Set to all ones in all training control words. |
| 3:0 | DIP-4 | 4-bit Diagonal Interleaved Parity.<br><br>4-bit odd parity computed over the current control word and the immediately preceding data words (if any) following the last control word. |

FIG. 6A

| | Bit [15:12] | Next Word Status | Prior Word Status | Meaning |
|---|---|---|---|---|
| 0 | 0000 | Idle | Continued | Idle, not EOP, training control word |
| 1 | 0001 | Reserved | Reserved | Reserved |
| 2 | 0010 | Idle | EOP w/abort | Idle, Abort last packet |
| 3 | 0011 | Reserved | Reserved | Reserved |
| 4 | 0100 | Idle | EOP w/2 bytes | Idle, EOP with 2 bytes valid |
| 5 | 0101 | Reserved | Reserved | Reserved |
| 6 | 0110 | Valid | EOP w/1 byte | Idle, EOP with 1 byte valid |
| 7 | 0111 | Reserved | Reserved | Reserved |
| 8 | 1000 | Valid | None | Valid, no SOP, no EOP |
| 9 | 1001 | Valid/SOP | None | Valid, SOP, no EOP |
| A | 1010 | Valid | EOP w/abort | Valid, no SOP, abort |
| B | 1011 | Valid/SOP | EOP w/abort | Valid, SOP, abort |
| C | 1100 | Valid | EOP w/2 bytes | Valid, no SOP, EOP with 2 bytes valid |
| D | 1101 | Valid | EOP w/2 bytes | Valid, SOP, EOP by 2 bytes valid |
| E | 1110 | Valid | EOP w/1 byte | Valid, no SOP, EOP with 1 byte valid |
| F | 1111 | Valid | EOP w/1 byte | Valid, SOP, EOP with 1 byte valid |

FIG. 6B

| Control Word | Description |
|---|---|
| 0110 00000000 abcd | Idle control word following end of transfer. End-of-packet, normal termination, 1 byte valid in last data word. (Note: abcd bits depend on contents of this control word and preceding transfer.) |
| 0000 00000000 1111 | Idle control word preceded by another (idle) control word. |
| 1101 00000101 abcd | Payload control word following end of transfer. End-of-packet, normal termination, 2 bytes valid in last data word of preceding transfer (abcd bits depend on contents of this control word and preceding transfer). |

FIG. 6C

DIP4 BIT MAP BUILDER

| Current | Previous | Bit Map |
|---------|----------|---------|
| control | data | chk_en = 0<br>mask = 0 |
| control | not data | chk_en = 1<br>mask = 1 |
| data | don't care | chk_en = 0<br>mask = 0 |

FIG. 10

| | Current Input | Type of Input | Prev. Input | bit map (2'bxy) x= chk_en; y=mask | Bit Map Decision | DIP4_err Calculation |
|---|---|---|---|---|---|---|
| STEP 1 | a(15:0) | data | | 2'b00 | If mask=0, use (A3, A2, A1, A0) ^ (P0, P3, P2, P1) → (PA3, PA2, PA1, PA0)<br><br>If mask=1, use (A3, A2, A1, A0) | Then, NAND (PA3, PA2, PA1, PA0) → latch into DIP4_err0 |
| STEP 2 | b(15:0) | data | | 2'b00 | If mask=0, use (B3, B2, B1, B0) ^ (PA0, PA3, PA2, PA1) → (PB3, PB2, PB1, PB0)<br><br>If mask=1, use (B3, B2, B1, B0) | Then, NAND (PB3, PB2, PB1, PB0) → latch into DIP4_err1 |
| STEP 3 | c(15:0) | control word | b1(data) | 2'b10 | If mask=0, use (C3, C2, C1, C0) ^ (PB0, PB3, PB2, PB1) → (PC3, PC2, PC1, PC0)<br><br>If mask=1, use (C3, C2, C1, C0) | Then, NAND (PC3, PC2, PC1, PC0) → latch into DIP4_err2 |
| STEP 4 | d(15:0) | control word | c1(control word) | 2'b11 | If mask=0, use (D3, D2, D1, D0) ^ (PC3, PC2, PC1, PC0)<br><br>If mask=1, use (D3, D2, D1, D0) | NAND (D3, D2, D1, D0) → DIP4_err3<br><br>Latch (D3, D2, D1, D0) → (P3, P2, P1, P0) |

FIG. 11

DISTRIBUTED 4-BITS DIAGONAL INTERLEAVED PARITY (DIP4) CHECKER

REFERENCE TO RELATED APPLICATION

This application claims priority of U.S. Provisional Patent Application Ser. No. 60/364,051, which was filed on Mar. 15, 2002. The subject matter of the earlier filed application is hereby incorporated by reference.

BACKGROUND OF THE INVENTION

1. Field of the Invention

This invention relates to an error detection method and apparatus. In particular, the invention is directed to a method and apparatus for detecting errors that may occur during a data transmission to an electronic device.

2. Description of the Related Art

In digital electronic systems, information is represented in binary format as "ones" and "zeroes". When binary information is transmitted from one electronic device to another device, there is a chance that the bits of the binary information may become corrupted. Corruption to the binary information may be caused by electronic noise, poor cable connections, media defects, component failures, as well as other factors. For example, home or office appliances having motors, such as fans, garbage disposals, blenders, and other devices can generate this type of noise, which adversely impacts the reception of an incoming digital signal. When noise or any other corruption affects an incoming digital signal such as a packet, the corrupted packet will typically be dropped and may need to be retransmitted by the source network device. When corruption develops within a digital signal, a bit error has occurred. Error detection is the process of detecting bit errors within a signal.

In digital electronic systems, information is represented in binary format as "ones" and "zeroes". When binary information is transmitted from one electronic device to another device, there is a chance that the bits of the binary information may become corrupted. Corruption to the binary information may be caused by electronic noise, poor cable connections, media defects, component failures, as well as other factors. For example, home or office appliances having motors, such as fans, garbage disposals, blenders, and other devices can generate this type of noise, which adversely impacts the reception of an incoming digital signal. When noise or any other corruption affects an incoming digital signal such as a packet, the corrupted packet will typically be dropped and may need to be retransmitted by the source network device. When corruption develops within a digital signal, a bit error has occurred. Error detection is the process of detecting bit errors within a signal.

In general at a transmitting device, a parity bit is appended to a block of data for the purpose of identifying whether the bits arrived at the destination device successfully. For example, with a single parity check, before the bits are sent, the "one" bits are counted and if the total of "one" bits is even, the parity bit is set to "one" so that the total number of "one" bits transmitted will form an odd number. If the total number of "one" bits is already an odd number, the parity bit remains or is set to "zero". At the destination device, each group of incoming bits is checked to determine if the number of "ones" in the group totals to an odd number. If the total is an even number, a transmission error has occurred and the transmission is typically retried.

In recent years, due to the advances in technology, it has become more difficult for some conventional devices to perform such error detection processes. The unprecedented demands for faster operating electronic devices have placed a greater demand on the operating components of current electronic devices. Unfortunately, some slower devices, which interface with the current state-of-the-art electronic devices, cannot operate at the same transfer rate. As a result of the speed mismatch, a timing difference between the interfaces of two such electronic devices may develop. This timing difference between the logic designs of the faster operating devices and the slower devices makes it more difficult for the receiving electrical device to detect whether an error has occurred within an incoming data stream.

Accordingly, new and improved systems and methods for detecting errors, which may occur within a transmission of binary information, are needed.

SUMMARY OF THE INVENTION

According to an embodiment of the invention, provided is a logic circuit, which includes an interface and an error detection unit. The interface is configured to receive and transmit a data stream, wherein the data stream includes at least one of a variable length format packet or burst and a fixed length format packet or burst. The error detection unit is configured to detect an error detection code when a misalignment occurs within the data stream by reursively calculating parity terms.

According to another embodiment of the invention, provided is a method of error detection within a logic circuit. The method includes a step of interfacing a first device having a first transfer rate with a second device having a second transfer rate. The method also includes the steps of receiving a data stream, detecting an error detection code error within the data stream; and recursively calculating parity terms.

According to another embodiment of the invention, provided is a system having a logic circuit which includes an interface means and an error detection means. The interface means is for receiving and transmitting a data stream, wherein the data stream includes at least one of a variable length format packet or burst and a fixed length format packet or burst. The error detection means is for detecting an error detection code error by recursively calculating a parity term.

BRIEF DESCRIPTION OF THE DRAWINGS

The objects and features of the invention will be more readily understood with reference to the following description and the attached drawings, wherein:

FIGS. 6A–6C illustrate examples of control words that may be inserted within a data stream according to an embodiment of the invention;

FIG. 10 shows a bit map builder according to an embodiment of the invention; and FIG. 11 is an example of an application of a bit map according to an embodiment of the invention.

DETAILED DESCRIPTION OF THE PREFERRED EMBODIMENTS

The invention is directed to a method and apparatus for a distributed parity bit checker and generator. The invention is also directed to a bit error detection method and apparatus to detect errors within a misaligned data stream and to locate a parity DIP4 code word for a misaligned data stream.

Figure 1:
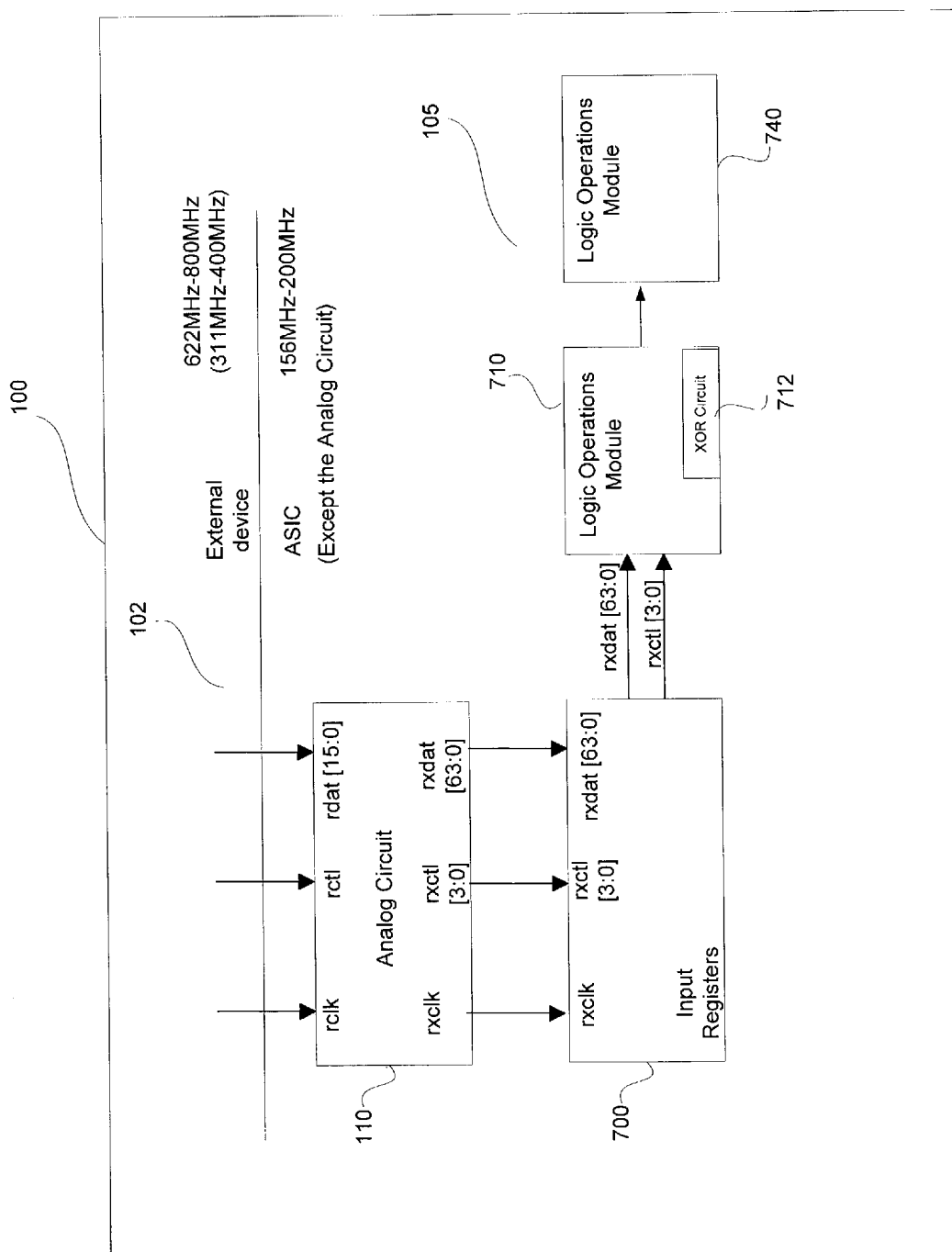
FIG. 1 is a block diagram of a network device according to an embodiment of the invention.

As discussed above, in electronic devices, which connect to other devices, there are many chips that may operate at different clock speeds. For example, an external chip may operate at two times, three times or four times the speed of an internal chip to which the external chip connects to and communicates with. For instance, as shown in FIG. 1, system 100 may include an interface between an external device 102 and an internal device 105, which may be a SPI-4 (System Packet Interface Level 4 Phase 2: OC-192 System Interface for Physical and Link Layer Devices) interface. SPI-4 may be an interface for packet and cell transfer between a physical layer (PHY) device and a link layer device, for aggregate bandwidths of OC-192 ATM and Packet over SONET/SDH (POS), as well as 10 Gb/s Ethernet applications. The SPI-4 interface may operate at a speed ranging from 622 MHz to 800 MHz. The components of internal device 105 may be an ASIC (Application-Specific Integrated Circuit). Thus, the clock rate may be half of the data rate (311 MHz 400 MHz) as shown in FIG. 1. However, the processing operation within internal device 105 may not be able to achieve the clock speed of the external device. Therefore, a circuit designer may increase the width of the internal data bus, which serves as a common pathway or channel between the internal and external device, to compensate for the clock speed. According to the embodiment as shown in FIG. 1, the internal bus width is expanded to be four times the width of the external bus size.

As shown in FIG. 1, the invention provides a method and apparatus so that external device 102 may interface with the internal device 105 so that both devices are capable of operating in a synchronized and coordinated manner. To achieve this interoperability between the external and internal device, internal device 105 includes an analog circuit 110 to synchronize the internal and external device.

FIG. 1 depicts the interface signals on the receiving side of internal device 105. The receive interface signals for internal device 105 may include a clock signal (RCLK), a control signal (RCTL) and a data signal (RDAT). RCLK may be a clock signal associated with transmitting data signals and control signals between a PHY device and a link layer device. The data and control lines may be driven off the rising and falling edges of the clock signal. RDAT may carry the payload data and the control word from the PHY to the link layer device. In mapping the incoming signals, RCTL may be configured so that it is set to a high level when a control word is present in RDAT. Otherwise, RCTL may be set to a low level.

Figure 2:
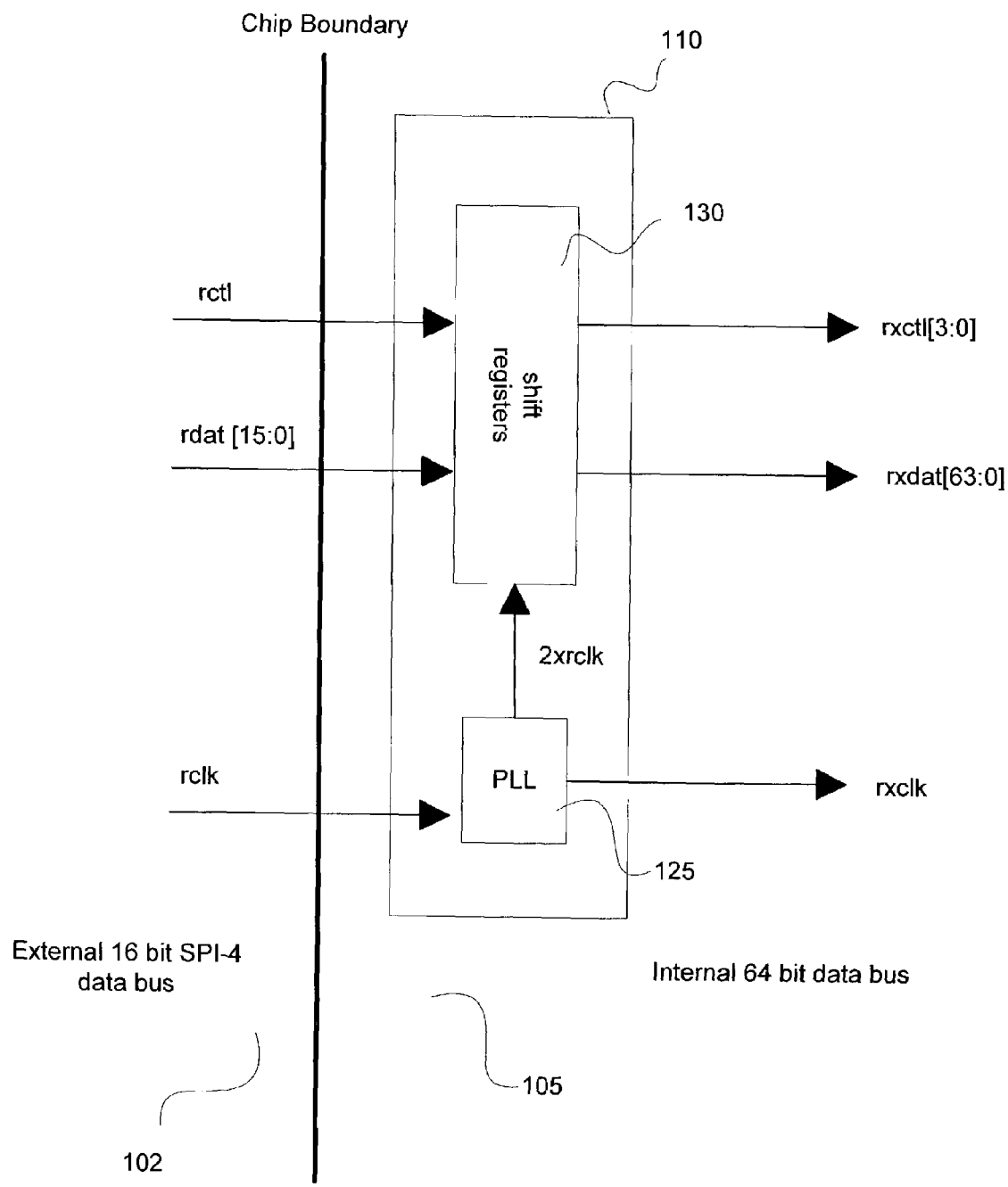
FIG. 2 is a block diagram of a chip boundary according to an embodiment of the invention.

FIG. 2 provides a further detailed illustration of the interface at internal device 105, which may be a chip. Analog circuit 110 may include a phase locked loop (PLL) 125 and shift registers 130. At the chip boundary as shown in FIG. 2, as the data stream arrives, RCLK is fed into the PLL. RDAT, which is a 16-bit data signal, and RCTL, which is a 1-bits control signal, are transferred into the shift registers 130 of analog circuit 110.

Figure 3A:
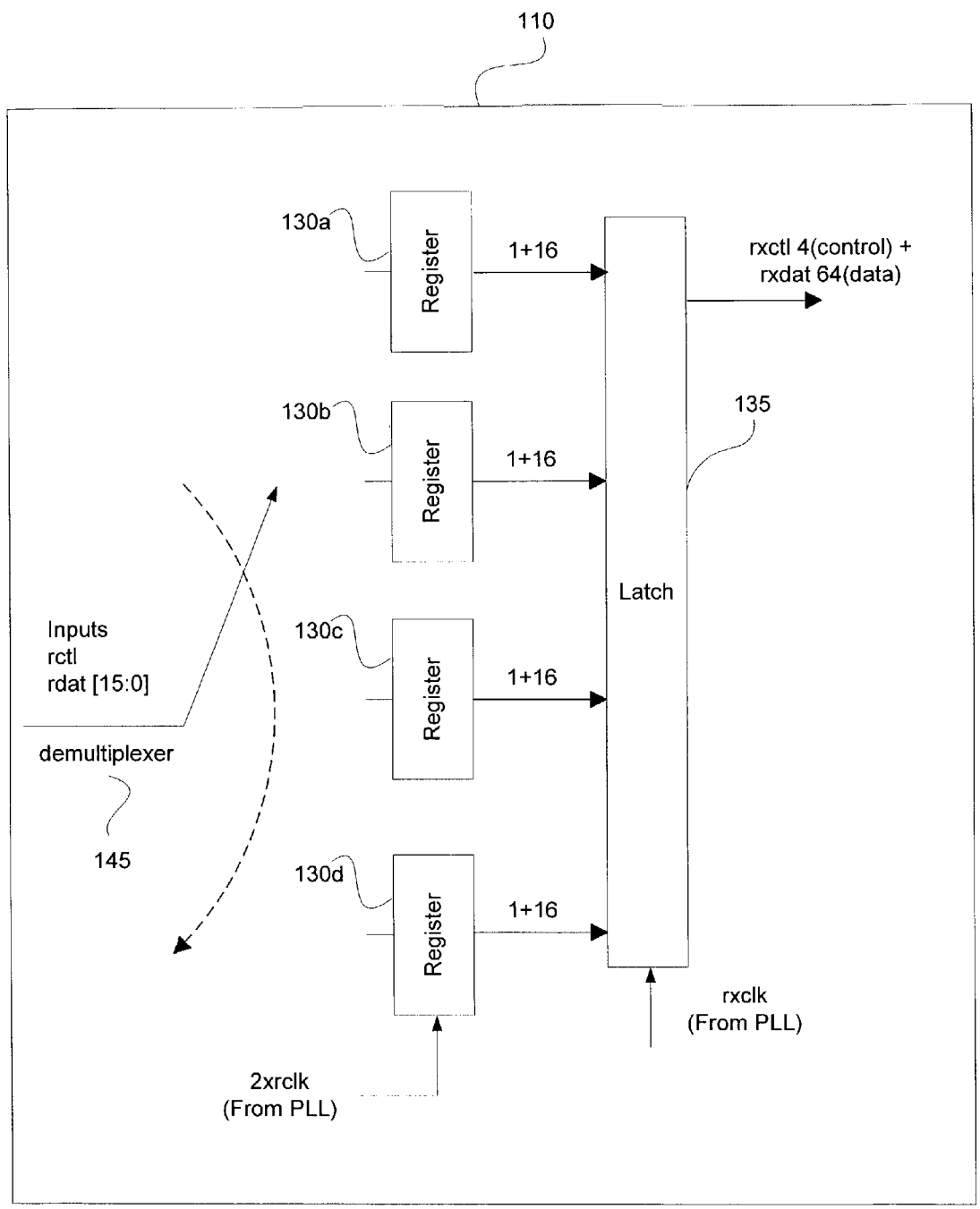
FIGS. 3A–3B illustrate the timing relationship between an internal bus and an external bus according to an embodiment of the invention.
Figure 3B:
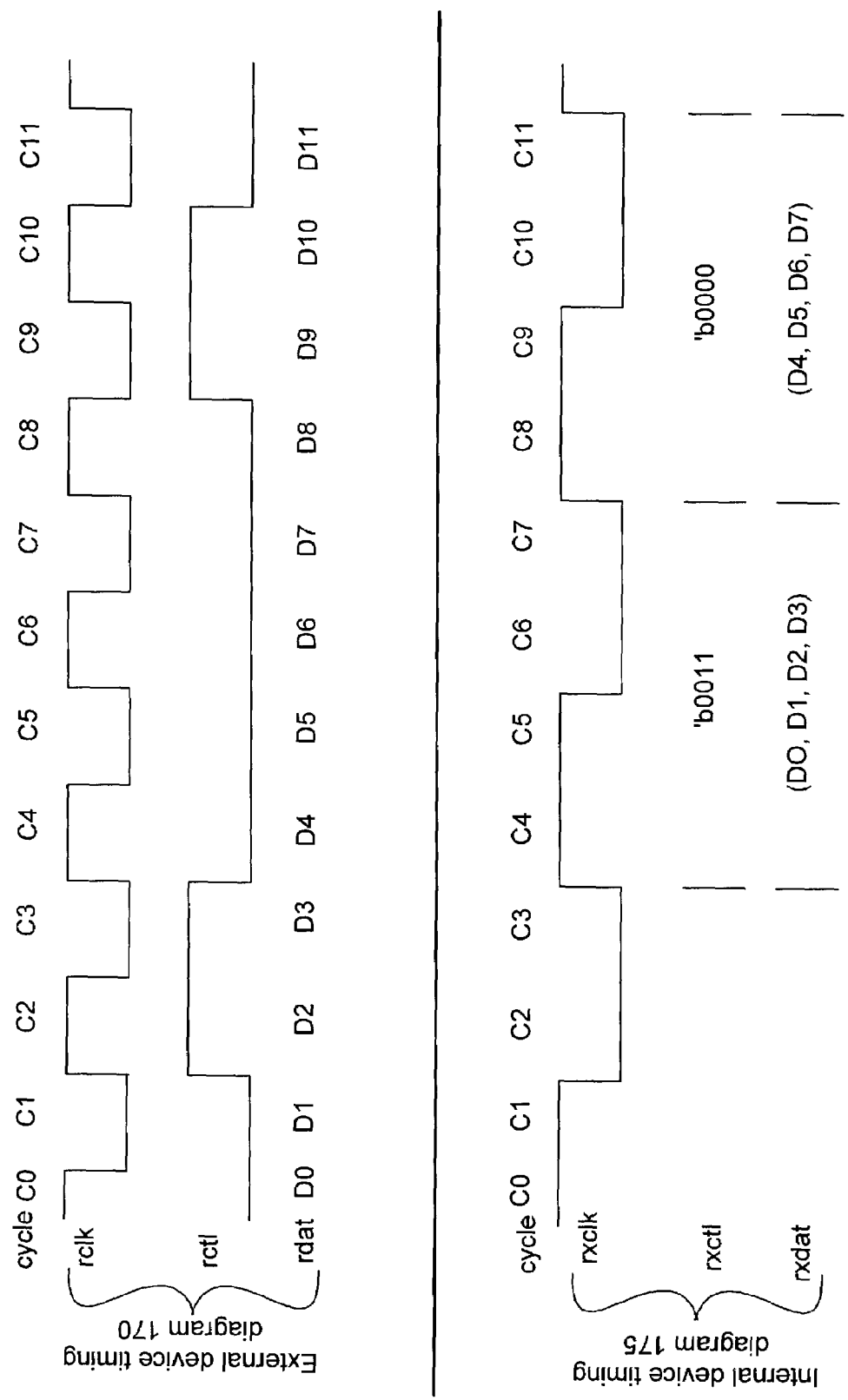

FIGS. 2–3 illustrate how the external 16-bit bus data received by chip 110 may be converted into 64-bit bus data. PLL 125 or some other frequency multiplication circuit may be used to generate the clock signals for the internal device 105. In order for the internal and external devices to synchronously communicate with each other, they need to have the correct cycle time relationship between their respective clocks and the clocks on the devices that they are communicating to. FIGS. 3A–3B show the timing relationship between the internal and external devices. In FIG. 3A, analog circuit 110 includes a demultiplexer 145 which directs the incoming bits of one clock cycle of the data stream from the external device to one of several registers 130a–d. For example, in FIG. 3A demultiplexer 145 directs the incoming data and control signals so that 16 bits of data signal RDAT and a 1-bit control signal RCTL for each clock cycle are directed to a respective one of four shift register 130a–d. PLL 125 may lock onto the external clock signal RCLK and generate a clock signal for shift registers 130a–d and latch 135 which will synchronize the internal and external devices. Shift registers 130a–d may receive an input from PLL 125 so that the shift registers 130a–d are clocked by a 2XRCLK clock signal transmitted from PLL 125. The 2XRCLK clock signal shifts each set of 16-bit data signals and 1-bit control signal into and out of shift registers 130a–d. The clock signal 2XRCLK transmitted from PLL 125 may be set to at least twice the frequency of the clock, RCLK, of external device 102.

Each set of 17bits (which includes the 16-bit data signal and the 1-bit control signal) from shift registers 130a–dare then transmitted to a latch circuit 135. Another clock signal RXCLK may be transmitted by PLL 125 to latch circuit 135 to achieve synchronization of the external and internal device's clock signals. The speed of RXCLK may be set equal to half of the speed of the external clock RCLK. The output of the latch 135 is a 4-bit control signal and a 64-bit data signal, which are synchronized with the input data from external device 102.

FIG. 3B illustrates a timing diagram of the mapping of the 16bits of the RDAT from external device to the 64 bits of RXDAT in the internal device. The external device timing diagram 170 shows the receipt of the 16-bit data at internal device 105. To map the 16 bits to 64 bits, at the beginning of the C4 cycle of the internal device timing diagram 175, the invention accumulates the data (D0, D1, D2, D3) from the previous four cycles (C0, C1, C2, C3) and outputs this grouping of data as the 64-bit data signal RXDAT (63:0) from latch 135 for the C4 clock period as shown in FIG. 3A. Similarly, for the C8 cycle in the internal timing diagram 175, the invention accumulates the data (D4, D5, D6, D7) and outputs this grouping of 64-bit data as RXDAT for the C8 cycle in the internal device timing diagram 175.

The invention also maps the control signal from external device 102 to internal device 105. The mapping of the control signal, RXCTL, which corresponds to the C4 clock period is shown by the term 'b0011, which represent four bit fields. The four bit fields indicate the level of control signal RCTL during cycles C1, C2, C3, and C4 in the external device timing diagram 170. As discussed above, RCTL may be a high level when a control word is present, and a low level otherwise. For example in FIG. 3A, the RCTL signal level for cycle C0 and C1 corresponds to "0", and the RCTL signal level for the C2 and C3 cycles are "1". Therefore, the control signal from the external device to internal device maps to a representation of the binary number 'b0011 as shown in the internal timing diagram 175.

Next, the 4-bit control signals and the 64-bit data signals are converted to a digital signal using an analog-to-digital converter (not shown), which may be a component of analog circuit 110. After converting the analog signals to a digital signal the digital signal is applied to input registers 700, as shown in FIG. 1.

Figure 4:
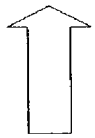
FIG. 4 illustrates canalization according to an embodiment of the invention.

However, converting the 16-bit data to 64-bit data may create the problem of data misalignment. In the 16-bit data bus domain of external device 102, data misalignment typically is not an issue because the 16-bit data are assigned to only one channel. In accumulating four groups of 16 bits, analog device 110 may select and retrieve one or more groups of data from one of several input channels (not shown) of internal device 105 and interleave the selected groups into a 64-bit grouping. Canalization occurs when data that belongs to different channels are transmitted in an interleaved manner. Canalization may be supported in an embodiment of the invention that employs a SPI-4 interface. An example of canalization, which is discussed below, is shown in FIG. 4.

At the input channels (not shown) of internal device 105, the invention may be designed to receive several types of input, for example, as shown in TABLE I.

TABLE I

| | |
|---|---|
| CW | control word |
| PCLW | payload control word |
| IC | Idle control word |
| TCW | training control word |
| Data word | control bit is inactivated |
| TDW | training data word |
| Data | payload data |

Figure 5A:
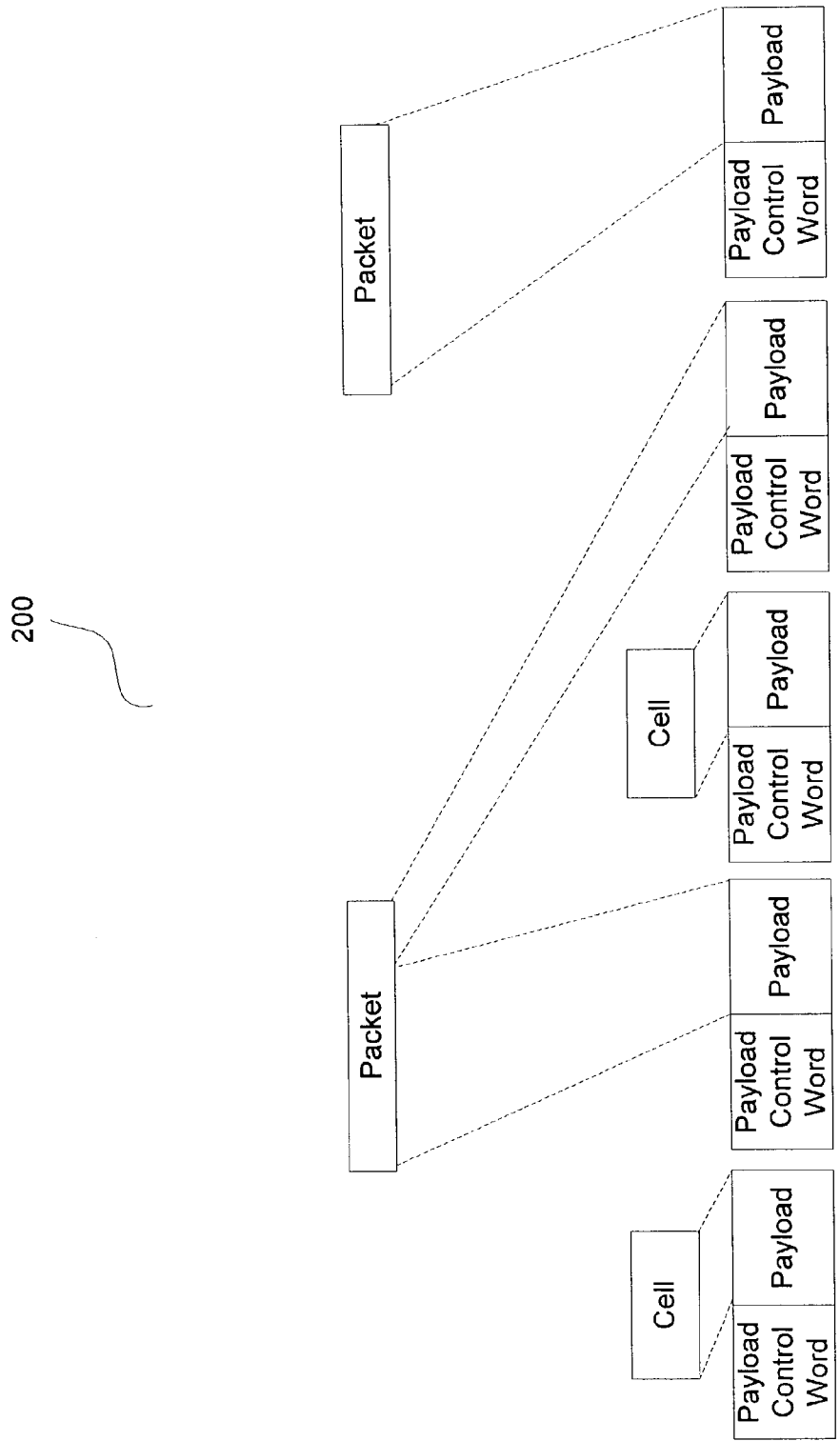
FIGS. 5A–5B illustrate examples of data streams that may be transmitted to a logic device according to the invention.

As shown in FIG. 5A, the binary information is transferred into internal device 105 as a data stream 200 having minimum and maximum length as determined by a particular application. FIG. 5A provides an illustration of variable-length format packets, mapped onto cell payloads of the data stream. Thus, cell payloads carrying complete packets or shorter bursts may be transferred in data stream 200. Control words may be inserted between the burst or packet transfers. These control words contain the error control coding, also referred to as the parity bits. The parity bits may inform internal device 105 if an error has occurred. Once an error is detected, the destination device may request a retransmission of the corrupted data from the source device.

Figure 5B:
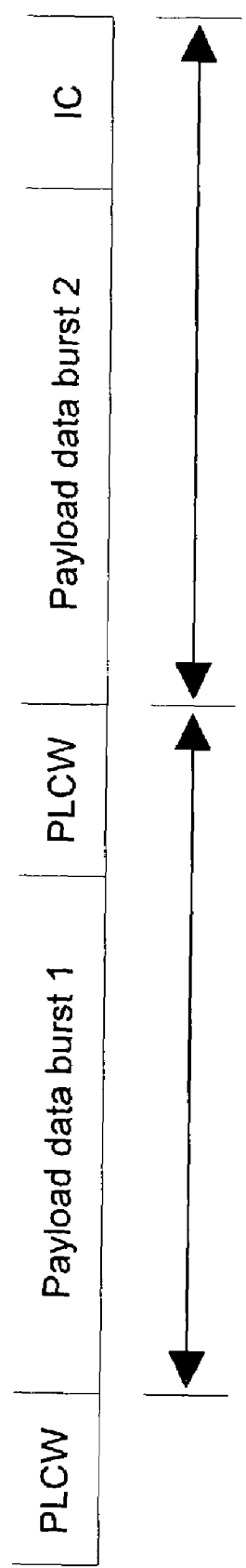

The control word may be an idle control word, payload control and/or training control word. The control words shown in FIG. 5A, are payload control words that may separate two adjacent burst or packet transfers, and the control words may contain the status information pertaining to the previous transfer and the following transfer. Once a transfer has begun, data words may be sent uninterrupted until the end-of-packet (EOP) or a multiple of a predetermined number of 16 bytes is reached. The system may be designed so that the cell payload is a multiple of 16 bytes. The interval between the end of a given transfer and the next payload control word, which may mark the start of another transfer or start-of-packet (SOP), may consist of zero or idle control words and/or training patterns. Specifically, the gap between shorter packets may be filled with idle control words. As shown in FIG. 5B, the control word may be appended to the end of a burst. If the information is being transmitted in as packets, each packet may be divided into multiples of 16 bytes, with the possible exception of the end-of-the packet data. The end-of-the packet data may be of any length, with an integer number of bytes.

FIG. 6A describes some of the fields that may be included in the control word. FIG. 6B shows a list of sample control word types. FIG. 6C shows examples of valid control words.

As discussed above, data misalignment may occur in an electronic device due to canalization. In FIG. 4, clock cycles C1, C2, C3, C4, C5, C6, C7, C8, and C9, are shown. Analog device 110 may select the input of the incoming data stream from the input channels (not shown) so that the input may be arranged in the pipeline as shown in FIG. 4. In mapping the data input as shown in FIG. 4, the term "dij" may be used, where the symbol "d" represents a "data" input, the symbol "i" represents the channel number and the symbol "j" represents the "jth" 16-bit data belonging to channel "i." For example, "d15" in the column of cycle c2 may be read as the $5^{th}$ data bit transmitted from channel 1. Accordingly, in the columns of cycles C1 and C3 of the example shown in FIG. 4, a payload control word PC and channel 1 data are being transmitted. In cycle C2, only channel 1 data is being transmitted. In cycle C4, only channel 2 data is being transmitted. In cycle C5, channel 1 data (1a), channel 2 data (d24) and two payload control words (PC) are being transmitted. In cycle C5, the end of the packet for channel 1 data is provided, and channel 2 data begins to be transmitted. In cycle C6, channel 2 data, an idle control word (IC) and a payload control word (PC) are being transmitted. In cycle C6, this is the end of the packet for channel 2 data, and channel 3 data begins in cycle c7. In cycles C7 and C8, only channel 3 data is being transmitted. In cycle C9, only idle control words (IC) are being transmitted.

In cycle C5, where data that belongs to both channel 1 and channel 2 is being transmitted, there is a chance that data misalignment may occur due to the fact that cycle C5 includes the end of the packet for channel 1, which may be a variable-length formet packet, and the end of the packet for channel 1 is followed by a payload control word PC. Due to the data misalignment, which may be caused by the variable-length formet packets, a problem may also arise in locating the parity bits and detecting whether an error has occurred within the data stream.

Figure 7:
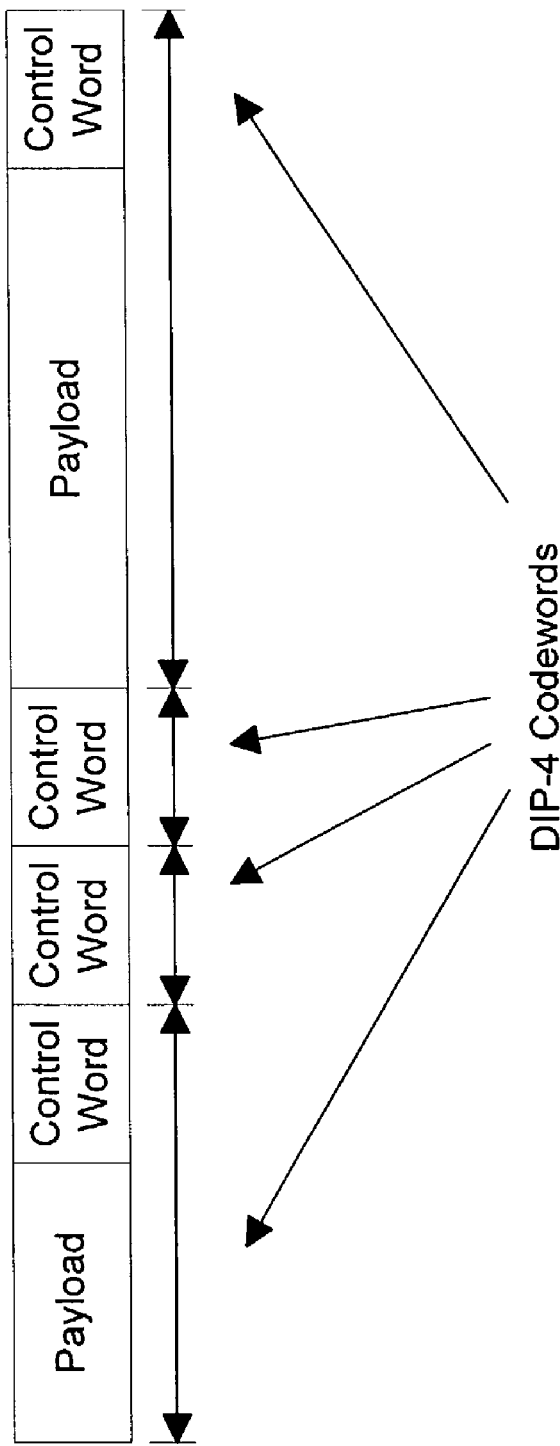
FIG. 7 depicts an exemplary range over which parity bits within a data stream may be computed according to an embodiment of the invention.

The invention provides a method and apparatus for generating a parity DIP4 code word and for detecting whether an error has occurred during a data stream transmission to a destination device although data misalignment may have occurred within the data stream. FIG. 7 depicts an example of the range over which the DIP4 parity bits within data stream 200 may be computed. The invention may be employed in locating DIP4 parity.

Figure 8:
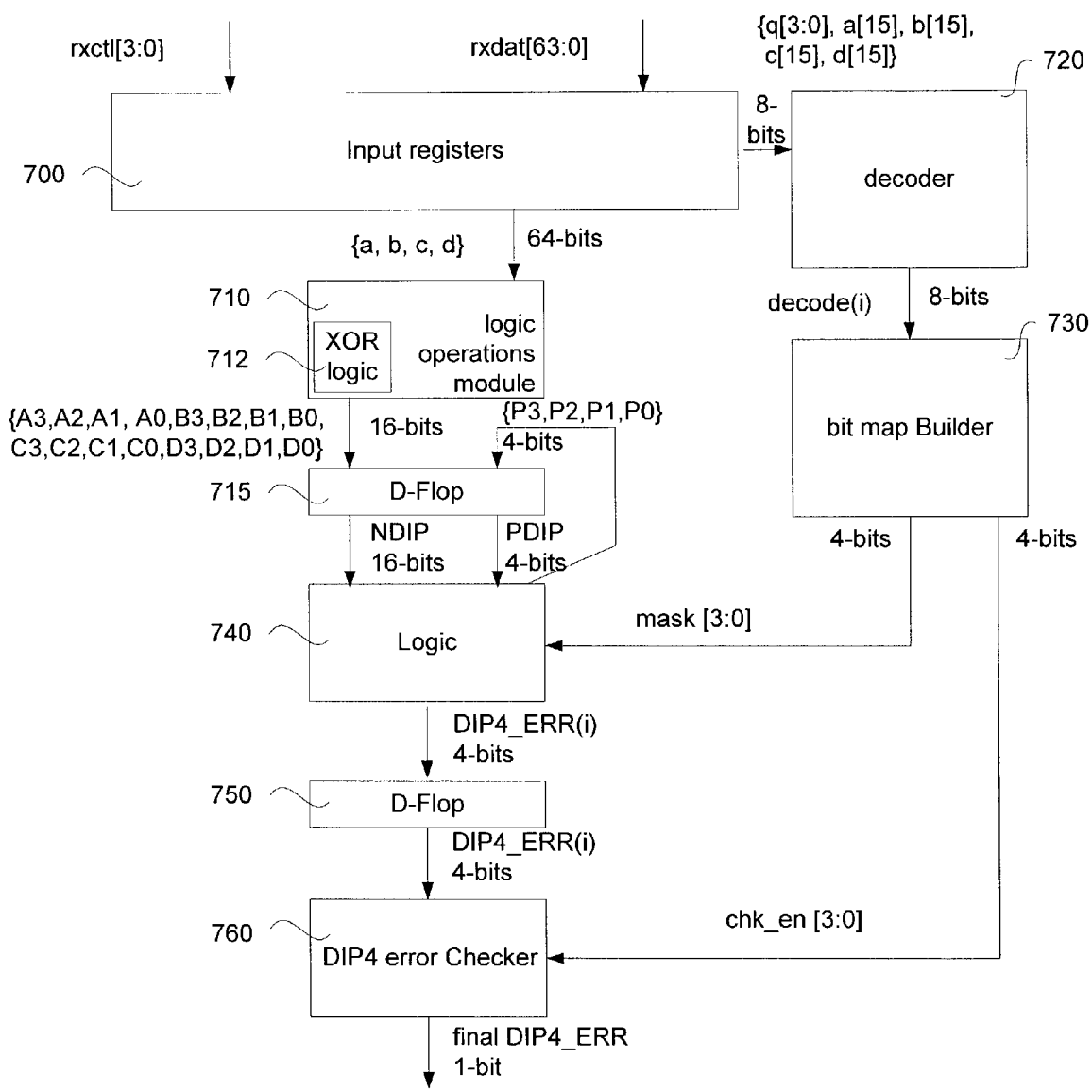
FIG. 8 is a block diagram of error detection according to an embodiment of the invention.

FIG. 8 depicts a block diagram of a system and method for detecting errors within a data stream according to an embodiment of the invention. As discussed above and shown in FIGS. 1–3, the 4-bit control signal, RXCTL, and the 64-bit data signal, RXDAT, are applied to input registers 700. Input registers 700 latch the 4-bit control signals and the 64-bit data signals within the incoming data stream. Input registers 700 may divide the 64 bits of the data signal, for example, into four groupings as a, b, c, and d. Each of the outputs a, b, c, and d constitutes a 16-bit grouping having a relationship as defined in TABLE II below:

TABLE II a=RXDAT(63:48)
b=RXDAT(47:32)
c=RXDAT(31:16)
d=RXDAT(15:0)

Initially, inputs a, b, c, and d may be received by input registers 700 and then transmitted to logic operations module 710. The logic operations module 710 may perform several logic operations on the incoming 64 bits to reduce the 64 bits into a smaller, more manageable array of intermediate parity terms, which will require less mathematical computations to complete the parity check summing than the original 64 bits input. The logic operations performed by logic operation module 710 may be performed on any size data stream. Thus, the number and size of the rows calculated and arranged by logic operations module 710 may be determined based upon detection capabilities of the particular application. The invention may include a central processing unit or a processor (both not shown) to perform the mathematical computations, control instructions and provide timings signals and implement other operations.

Figure 9A:
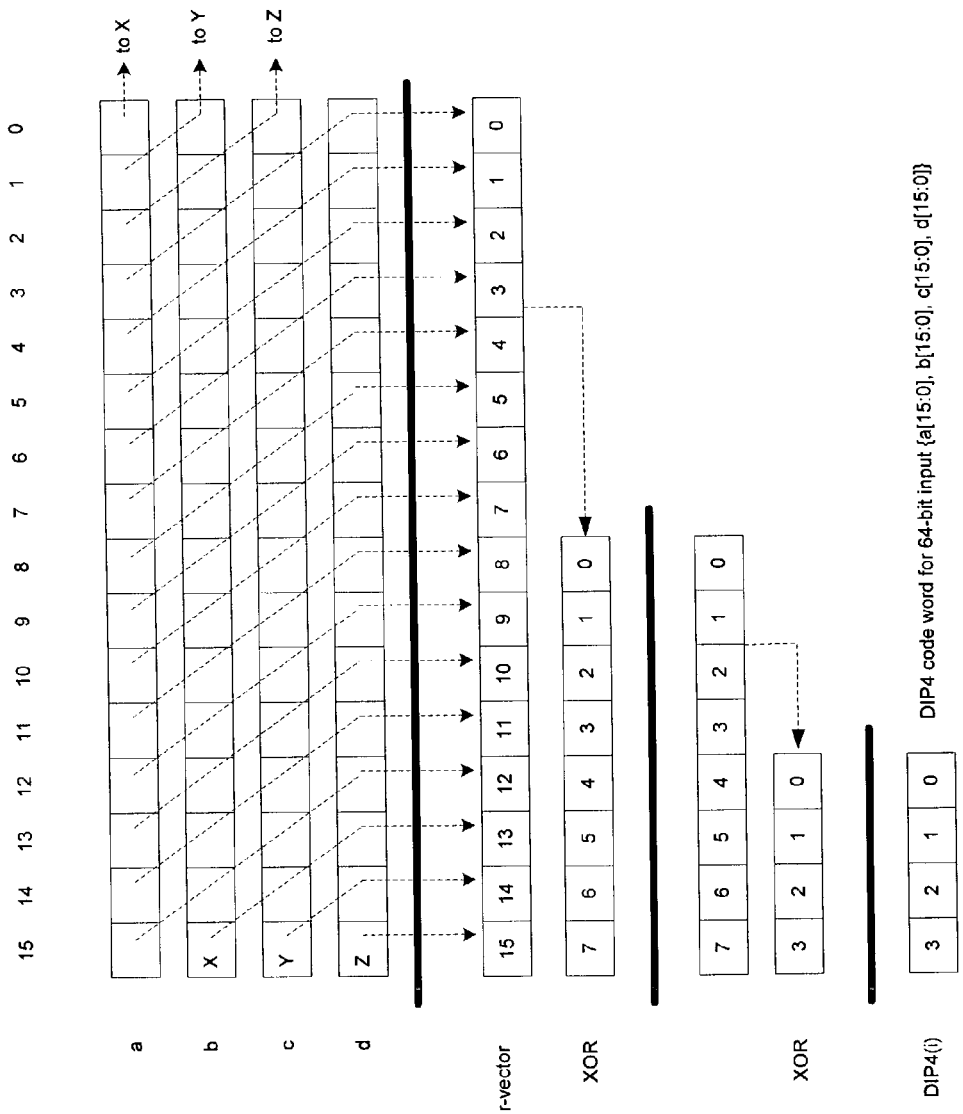
FIGS. 9A–9B illustrate the detection of a parity DIP4 code word according to an embodiment of the invention.
Figure 9B:
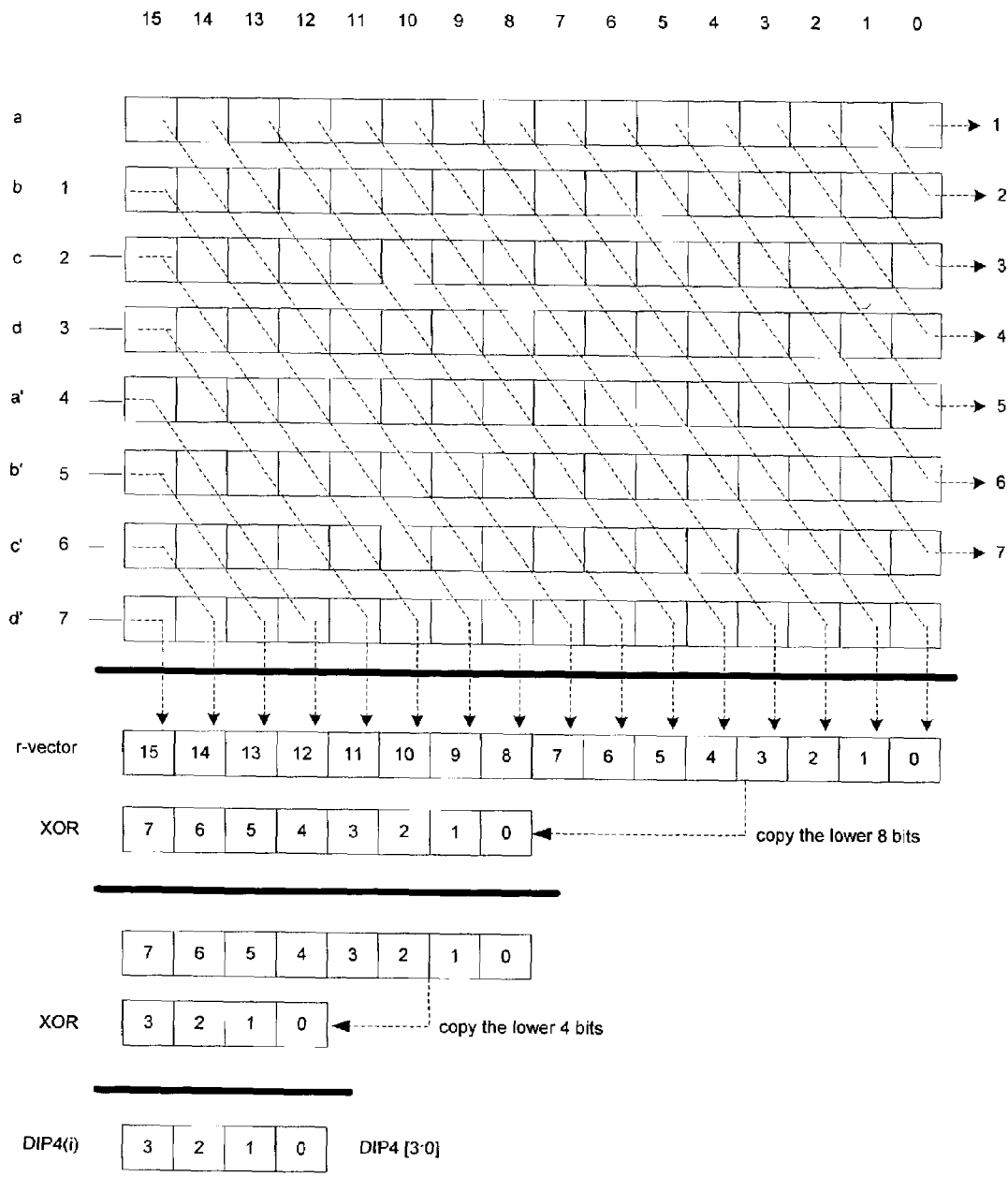

Logic operations module 710 may include one or more exclusive-or (XOR) logic circuits 712. XOR circuit 712 may use inputs a, b, c, and d to recursively calculate a term using a diagonal interleaved parity (DIP4) technique as shown in FIGS. 9A–9B. In FIG. 9A, the generation of, for example, an odd parity DIP4 code word may be calculated using the (DIP4) technique. The 64 bits that have been grouped as a, b, c, and d of the incoming data stream may be arranged so that the first word of input "d" received is positioned in the bottom row of the matrix and the last word of input "a" is at the top of the matrix. The DIP4 code may be generated by summing diagonally along the dashed lines to generate a 16-bit parity sum. Thus, each bit of the 16-bit parity sum is the result of an XOR operation along the corresponding dashed lines. The XOR operation is indicated in the tables of this discussion by an "^" symbol. In FIG. 9A, the 16-bits parity sum may be represented as r-vector, r(15:0). The 64-bit data signal is defined according to r(15:0) as illustrated in TABLE III below.

TABLE III

| r(15) = | d(15) | ^c(0) | ^b(1) | ^a(2) |
|---|---|---|---|---|
| r(14) = | d(14) | ^c(15) | ^b(0) | ^a(1) |
| r(13) = | d(13) | ^c(14) | ^b(15) | ^a(0) |
| r(12) = | d(12) | ^c(13) | ^b(14) | ^a(15) |
| r(11) = | d(11) | ^c(12) | ^b(13) | ^a(14) |
| r(10) = | d(10) | ^c(11) | ^b(12) | ^a(13) |
| r(9) = | d(9) | ^c(10) | ^b(11) | ^a(12) |
| r(8) = | d(8) | ^c(9) | ^b(10) | ^a(11) |
| r(7) = | d(7) | ^c(8) | ^b(9) | ^a(10) |
| r(6) = | d(6) | ^c(7) | ^b(8) | ^a(9) |
| r(5) = | d(5) | ^c(6) | ^b(7) | ^a(8) |
| r(4) = | d(4) | ^c(5) | ^b(6) | ^a(7) |
| r(3) = | d(3) | ^c(4) | ^b(5) | ^a(6) |
| r(2) = | d(2) | ^c(3) | ^b(4) | ^a(5) |
| r(1) = | d(1) | ^c(2) | ^b(3) | ^a(4) |
| r(0) = | d(0) | ^c(1) | ^b(2) | ^a(3) |

As shown in FIG. 9A, the first 16-bit checksum may be split into two bytes, which are added to each other modulo-2 to produce an 8-bit checksum. The term "modulo" describes the maximum number of states for the counter performing the addition of the 8-bit checksum. The 8-bit checksum may then be divided into two 4-bit nibbles. A nibble is a sequence of 4-bits that is operated upon as a unit. The two 4-bit nibbles are added bitwise to the modulo-2 to produce the DIP4 code, as defined in TABLE IV below and shown in FIG. 9A.

TABLE IV

| DIP4(3) = | r(15)^ | r(11)^ | r(7)^ | r(3) |
|---|---|---|---|---|
| DIP4(2) = | r(14)^ | r(10)^ | r(6)^ | r(2) |
| DIP4(1) = | r(13)^ | r(9)^ | r(5)^ | r(1) |
| DIP4(0) = | r(12)^ | r(8)^ | r(4)^ | r(0) |

Logic operations module 710 may calculate each DIP4(i) by performing XOR operations using XOR circuits 712. For example, as shown in TABLE IV, the DIP4(3) may be determined by performing an XOR operation on the vectors of the r(15), r(11), r(7) and r(3). The respective terms for determining r(15), r(11), r(7) and r(3) are shown in TABLE III. For example, in TABLE III, r(15) equals the XOR operation of d(15), c(0), b(1), and a(2). In TABLE I, r(11) equals the XOR operation of d(11), c(12), b(13), and a(14). The terms r(7) and r(3) can be selected and XOR-ed in a similar manner.

According to an embodiment of the invention, if the incoming data stream 200 is a data burst, the state of the previously calculated parity bits (PDIP) may be latched or retained to aid in the calculation of the next parity bits (NDIP). Namely, the calculation of the NDIP bits is an iterative process. Thus, each parity bit may be used as feedback into the subsequent calculation of the next parity bit in an iterative routine. Intermediate parity bit terms may be generated as a flag to determine whether the PDIP will be used in performing the calculation of the subsequent NDIP, as discussed below with regards to logic operations module 740. To aid in the iterative process of calculating NDIP, the invention may generate intermediate parity in accordance with a matrix key.

As shown in TABLE IV, the original 64-bit input has been reduced to 4 bits, DIP4(3), DIP4(2), DIP4(1), DIP4(0). Thus, the DIP4(i) terms can be mapped to a 4×4 matrix, as four bits assigned to four columns. Thus, logic operation module 710 may generate intermediate parity in accordance with a corresponding matrix key, which includes four rows of bits (labeled as 1, 2, 3,) and four columns as shown in TABLE V(a). In generating the matrix key TABLE V(a), the four rows of bits in Column 1 may be numbered from 3, 2, 1, 0 wherein 3 is positioned at the top right hand-column and 0 is positioned in the last row of the first column. In the second column, the four rows of bits may be arranged such that the numbers are shifted vertically by one bit in comparison to the bits in column 1. Thus, for example, the rows of bits in column 2 are arranged vertically as 0, 3, 2, and 1.

TABLE V(a)

| Column 1 | Column 2 | Column 3 | Column 4 |
|---|---|---|---|
| 3 | 0 | 1 | 2 |
| 2 | 3 | 0 | 1 |
| 1 | 2 | 3 | 0 |
| 0 | 1 | 2 | 3 |

In the next step of generating the matrix key, logic operations module 710 may then re-label the columns in TABLE V(a) to include vectors A, B, C, and D as shown in TABLE V(b). For example, Column 1, which includes the bits arranged as 3, 2, 1, 0, in TABLE V(a) may be relabeled as D column, which includes D3, D2, D1, D0, respectively. The remaining columns may be relabeled as C column, B column, and A column, respectively.

TABLE V(b)

| D column | C column | B column | A column |
|----------|----------|----------|----------|
| D3 | C0 | B1 | A2 |
| D2 | C3 | B0 | A1 |
| D1 | C2 | B3 | A0 |
| D0 | C1 | B2 | A3 |

Logic operations module 710 may now use the "D," "C," "B," and "A"—column groupings shown in TABLE V(b) to calculate the DIP(i) terms in TABLE IV. For example, row 1 of TABLE VI may be set to equal DIP4(3). Thus the first row of TABLE VI may be assigned so that DIP4(3) now equals the XOR operation of D3^C0^B1^A2. DIP4(2), DIP4(1) and DIP4(0) can be calculated in a similar manner by logic operations module 710.

TABLE VI

|  | D column | C column | B column | A column |
|---|---|---|---|---|
| DIP4(3) = | D3^ | C0^ | B1^ | A2 |
| DIP4(2) = | D2^ | C3^ | B0^ | A1 |
| DIP4(1) = | D1^ | C2^ | B3^ | A0 |
| DIP4(0) = | D0^ | C1^ | B2^ | A3 |

Logic operations module 710 may then substitute and combine the terms of TABLE III, IV, and VI to generate the matrix key, shown in TABLE VII. To perform a DIP4(i) calculation, the system may use the matrix key in TABLE VII to select the relevant bits for each DIP4(i) term. Thus, the DIP4(i) code for the original 64-bit data signal can be expressed according to the equations shown in TABLE VIII below. For instance, the D3 term of DIP4(3), in TABLE VII, equals the XOR operation of d(15), d(11), d(7) and d(3) as shown in TABLE VIII. As another example, the A1 term of DIP4(2) equals the XOR operation of a(1), a(3), a(9) and a(5) as shown in TABLE VIII.

TABLE VII

|  | P column | D column | C column | B column | A column |
|---|---|---|---|---|---|
| dip4(3) = | = P(3) = | D3 ^ | C0 ^ | B1 ^ | A2 |
| dip4(2) = | = P(2) = | D2 ^ | C3 ^ | B0 ^ | A1 |
| dip4(1) = | = P(1) = | D1 ^ | C2 ^ | B3 ^ | A0 |
| dip4(0) = | = P(0) = | D0 ^ | C1 ^ | B2 ^ | A3 |

TABLE VII illustrates that the original 64-bits data input have been reduced to a smaller, more manageable array having sixteen indices. The P-terms listed in TABLE VII can be assigned as the PDIP in determining whether the current DIP4 terms will be used in performing the calculation of the subsequent NDIP. The DIP4(i) calculation generated by XOR circuits 712 renders sixteen variables, A0, A1, A2, A3, B0, B1, B2, B3, C0, C1, C2, C3, D0, D1, D2, and D3.

TABLE VIII

| A3 = | a(15) | ^a(11) | ^a(7) | ^a(3) |
|---|---|---|---|---|
| A2 = | a(14) | ^a(10) | ^a(6) | ^a(2) |
| A1 = | a(13) | ^a(9) | ^a(5) | ^a(1) |
| A0 = | a(12) | ^a(8) | ^a(4) | ^a(0) |
| B3 = | b(15) | ^b(11) | ^b(7) | ^b(3) |
| B2 = | b(14) | ^b(10) | ^b(6) | ^b(2) |
| B1 = | b(13) | ^b(9) | ^b(5) | ^b(1) |
| B0 = | b(12) | ^b(8) | ^b(4) | ^b(0) |
| C3 = | c(15) | ^c(11) | ^c(7) | ^c(3) |
| C2 = | c(14) | ^c(10) | ^c(6) | ^c(2) |
| C1 = | c(13) | ^c(9) | ^c(5) | ^c(1) |
| C0 = | c(12) | ^c(8) | ^c(4) | ^c(0) |
| D3 = | d(15) | ^d(11) | ^d(7) | ^d(3) |
| D2 = | d(14) | ^d(10) | ^d(6) | ^d(2) |
| D1 = | d(13) | ^d(9) | ^d(5) | ^d(1) |
| D0 = | d(12) | ^d(8) | ^d(4) | ^d(0) |

As shown in FIG. 8, after each DIP4(i) has been calculated by logic operations module 710, the A3, A2, A1, A0, AB3, B2, B1, B0, C3, C2, C1, D3, D2, D1, and D0 values are transferred to a D-flop 715. D-flop 715 also includes a PDIP register (not shown), which holds the PDIP information, which is discussed below.

FIG. 9B illustrates another example of an embodiment of the invention where internal device 105 receives two 64-bit input data, which may be noted as (a, b, c, d) and (a', b', c', d'). The two 64-bits inputs in FIG. 9B may be generated using the same procedures discussed regarding FIG. 9A. Thus, logic operations module 710 and XOR circuit 712 may generate TABLE IX, which corresponds to TABLE III. TABLE X may be generated using the procedures discussed regarding TABLE IV, and TABLE XI may be generated using the procedures discussed regarding TABLE VII.

TABLE IX

| r(15) = | d'(15) | ^c'(0) | ^b'(1) | ^a'(2) | ^d(3) | ^c(4) | ^b(5) | ^a(6) |
|---|---|---|---|---|---|---|---|---|
| r(14) = | d'(14) | ^c'(15) | ^b'(0) | ^a'(1) | ^d(2) | ^c(3) | ^b(4) | ^a(5) |
| r(13) = | d'(13) | ^c'(14) | ^b'(15) | ^a'(0) | ^d(1) | ^c(2) | ^b(3) | ^a(4) |
| r(12) = | d'(12) | ^c'(13) | ^b'(14) | ^a'(15) | ^d(0) | ^c(1) | ^b(2) | ^a(3) |
| r(11) = | d'(11) | ^c'(12) | ^b'(13) | ^a'(14) | ^d(15) | ^c(0) | ^b(1) | ^a(2) |
| r(10) = | d'(10) | ^c'(11) | ^b'(12) | ^a'(13) | ^d(14) | ^c(15) | ^b(0) | ^a(1) |
| r(9) = | d'(9) | ^c'(10) | ^b'(11) | ^a'(12) | ^d(13) | ^c(14) | ^b(15) | ^a(0) |
| r(8) = | d'(8) | ^c'(9) | ^b'(10) | ^a'(11) | ^d(12) | ^c(13) | ^b(14) | ^a(15) |
| r(7) = | d'(7) | ^c'(8) | ^b'(9) | ^a'(10) | ^d(11) | ^c(12) | ^b(13) | ^a(14) |
| r(6) = | d'(6) | ^c'(7) | ^b'(8) | ^a'(9) | ^d(10) | ^c(11) | ^b(12) | ^a(13) |
| r(5) = | d'(5) | ^c'(6) | ^b'(7) | ^a'(8) | ^d(9) | ^c(10) | ^b(11) | ^a(12) |
| r(4) = | d'(4) | ^c'(5) | ^b'(6) | ^a'(7) | ^d(8) | ^c(9) | ^b(10) | ^a(11) |
| r(3) = | d'(3) | ^c'(4) | ^b'(5) | ^a'(6) | ^d(7) | ^c(8) | ^b(9) | ^a(10) |
| r(2) = | d'(2) | ^c'(3) | ^b'(4) | ^a'(5) | ^d(6) | ^c(7) | ^b(8) | ^a(9) |

TABLE IX-continued

| r(1) = | d'(1) | ĉ'(2) | b̂'(3) | â'(4) | d̂(5) | ĉ(6) | b̂(7) | â(8) |
|---|---|---|---|---|---|---|---|---|
| r(0) = | d'(0) | ĉ'(1) | b̂'(2) | â'(3) | d̂(4) | d̂(5) | ĉ(6) | â(7) |

TABLE X

| DIP4(3) = | r(15) | r̂(11) | r̂(7) | r̂(3) |
|---|---|---|---|---|
| = | d'(15) | d'(11) | d̂'(7) | d̂'(3) |
|  | ĉ'(12) | c'(8) | ĉ'(4) | ĉ'(0) |
|  | b̂'(1) | b'(13) | b̂'(9) | b̂'(5) |
|  | â(14) | a'(10) | â'(6) | â'(2) |
|  | d̂(3) | d̂(4) | d̂(11) | d̂(15) |
|  | ĉ(4) | ĉ(8) | ĉ(12) | ĉ(16) |
|  | b̂(5) | b̂(9) | b̂(13) | b̂(1) |
|  | â(6) | â(10) | â(14) | â(2) |
| DIP4(2) = | r(14) | r̂(10) | r̂(6) | r̂(2) |
| = | d'(14) | d'(10) | d̂'(6) | d̂'(2) |
|  | ĉ'(15) | c'(11) | ĉ'(7) | ĉ'(3) |
|  | b̂'(0) | b'(4) | b̂'(8) | b̂'(12) |
|  | â'(1) | a'(5) | â'(9) | â'(13) |
|  | d̂(2) | d̂(6) | d̂(10) | d̂(14) |
|  | ĉ(3) | ĉ(7) | ĉ(11) | ĉ(15) |
|  | b̂(4) | b̂(8) | b̂(12) | b̂(0) |
|  | â(5) | â(9) | â(13) | â(1) |
| DIP4(1) = | r(13) | r̂(9) | r̂(5) | r̂(1) |
| = | d'(13) | d'(9) | d̂'(5) | d̂'(1) |
|  | ĉ'(14) | c'(10) | ĉ'(6) | ĉ'(2) |
|  | b̂'(15) | b'(11) | b̂'(7) | b̂'(3) |
|  | â'(0) | a'(4) | â'(8) | â'(12) |
|  | d̂(1) | d̂(5) | d̂(9) | d̂(13) |
|  | ĉ(2) | ĉ(6) | ĉ(10) | ĉ(14) |
|  | b̂(3) | b̂(7) | b̂(11) | b̂(15) |
|  | â(4) | â(8) | â(12) | â(0) |
| DIP4(0) = | r(12) | r̂(8) | r̂(4) | r̂(0) |
| = | d'(12) | d'(8) | d̂'(4) | d̂'(0) |
|  | ĉ'(13) | c'(9) | ĉ'(5) | ĉ'(1) |
|  | b̂'(14) | b'(10) | b̂'(6) | b̂'(2) |
|  | â'(15) | a'(11) | â'(7) | â'(3) |
|  | d̂(12) | d̂(8) | d̂(4) | d̂(0) |
|  | ĉ(13) | ĉ(9) | ĉ(5) | ĉ(1) |
|  | b̂(14) | b̂(10) | b̂(6) | b̂(2) |
|  | â(15) | â(11) | â(7) | â(3) |

TABLE XI

| DIP4(3) = | D'(3) | Ĉ'(0) | B̂'(1) | Â'(2) | D̂(3) | Ĉ(0) | B̂(1) | Â(2) |
|---|---|---|---|---|---|---|---|---|
| DIP4(2) = | D'(2) | Ĉ'(3) | B̂'(0) | Â'(1) | D̂(2) | Ĉ(3) | B̂(0) | Â(1) |
| DIP4(1) = | D'(1) | Ĉ'(2) | B̂'(3) | Â'(0) | D̂(1) | Ĉ(2) | B̂(3) | Â(0) |
| DIP4(0) = | D'(0) | Ĉ'(1) | B̂'(2) | Â'(3) | D̂(0) | Ĉ(1) | B̂(2) | Â(3) |

One noted difference in comparing the calculations between FIG. 9A and FIG. 9B is that P(3), P(2), P(1), P(0) shown in TABLE XII may be set as a recursive term of the DIP4 codeword P(3:0) of the previous 64-bits input data determined in TABLE VII.

TABLE XII

| DIP4(3) = | D'(3) | Ĉ'(0) | B̂'(1) | Â'(2) | P̂(3) |
|---|---|---|---|---|---|
| DIP4(2) = | D'(2) | Ĉ'(3) | B̂'(0) | Â'(1) | P̂(2) |
| DIP4(1) = | D'(1) | Ĉ'(2) | B̂'(3) | Â'(0) | P̂(1) |
| DIP4(0) = | D'(0) | Ĉ'(1) | B̂'(2) | Â'(3) | P̂(0) |

As discussed above and shown in FIG. 8, input registers 700 (FIGS. 1–3 and 8) outputs bits of the 64-bits data signal, RXDAT(63:0), and the 4-bits control signal, RXCTL(3:0), to a decoder 720. Decoder 720 may be used to determine the type of information that is being transmitted within the data stream. One reason that the invention checks to determine the classification of the type of information that is being received into internal device 105 is because based upon the determination of whether the incoming information is either data or a control words, the invention will know whether or not to check that portion of the data stream in order to locate the DIP4 parity bits within the data stream. For example, it is noted that FIG. 10 indicates that when data is the current input, the invention may be configured so that this portion of the data stream is not inspected for DIP4 parity bits since the parity bits are included in the control words and not within the data input.

In order to classify the information within the data stream, the invention may, for example, transfer the portion of the 4-bits control signal after the control signal has been transferred through input registers 700. After the control signal passes through input registers 700, the control signal may be referred to as the latched portion q(3:0).

Input registers 700 latch the 64-bits data signal and the 4-bits control signal as shown below in TABLE XIII:

TABLE XIII

| a= RXDAT(63:48) |
|---|
| b= RXDAT(47:32) |
| c= RXDAT(31:16) |
| d= RXDAT(15:0) |
| q(3:0)= RXCTL(3:0) |

One method that may be used to determine the type of information contained within the incoming data stream is that decoder 720 may decode the latched portion q(3:0) and every 16$^{th}$ bit of the 64-bits data signal as shown in TABLE XIV below. This invention is not limited to only this bit identification technique. Other bit identification techniques may be employed by the invention.

Decoder 720 inspects the RXCTL produced in the internal device timing determine the type of information contained within the incoming data stream.

TABLE XIV

| Decode (3) = f(RXCTL (3), a(15)) |
|---|
| Decode (2) = f(RXCTL (2), b(15)) |
| Decode (1) = f(RXCTL (1), c(15)) |
| Decode (0) = f(RXCTL (0), d(15)) |

Decoder 720 decodes the RXCTLW and RDAT(15) to determine whether the information transmitted within each 16-bits grouping of a, b, c, d is data, an idle control word (IC), a training control word (TCW) or a payload control word (PLCW).

TABLE XV

| RXCTL | RXDAT(15) | Type of Information |
|---|---|---|
| 0 | 0 | Data |
| 0 | 1 | Data |
| 1 | 0 | IC or TCW |
| 1 | 1 | PLCW |

Decoder 720 may use TABLE XIV to determine the type of information being transmitted within the data stream. For example, if the binary number in the control word RXCTL data field is set equal "0" and the 16th bit RXDAT(15) is set to a "1", then decoder 720 will determine that the information is "data." As another example, if the binary number in the control word RXCTL data field is set equal to "1" and the RXDAT is also set equal to "1" based upon TABLE XV above, decoder 720 will determine that the information is a "PLCW."

For each 64-bit input, the system may perform this operation on each 16-bit group. Thus, the invention may perform this operation, for example, four times to generate a decode(i) output, which is transferred from decoder 720 to a bit map builder 730. The decode(i) information shown in TABLE XIV above may be used as the input to generate a bit map 730, as shown in FIG. 8. The bit map builder 730 may include two terms, a check enable bit and a mask bit. The check enable term may be used by the system to indicate in which position of the data stream the system will check for the parity bits, DIP4(i). For instance, the check enable bit may indicate to the system to check the DIP4(i) at a 16-bit location within the 64-bit data signal. The mask of the bit map assists the system in determining whether the previous parity bit, PDIP, will be used to calculate the next parity bit, NDIP. If the mask term is set equal to "1", this may indicate that the incoming data stream is the beginning of a new data burst. If the mask term is set equal to "0", this may indicate that data stream is still transmitting in a data burst phase.

In FIG. 8, logic operations module 740 may use the mask term, and the 16-variables transferred from D-flop 715 to calculate an intermediate terms DIP4_ERR(i) and to determine what terms will be used to calculate NPID. Ultimately, the intermediate term DIP4_ERR may or may not be used in the calculation of NPID. The determination of whether either the intermediate terms DIP4_ERR(i) or the 16-variable input will be used to calculate NDIP may depend upon a bit map decision calculation performed by logic operations module 740.

To calculate the intermediate terms DIP4_ERR(i), logic operations module 740 performs a bit map decision as shown in FIG. 11. In STEP 1 of FIG. 11, the logic operations module 740 performs a bit map decision on a(15:0). In processing the bit map decision, the logic operations module 740 determines if the mask for a(15:0) equals "0." If the mask equals "0", then the NDIP4 may be calculated using PDIP4. If the mask equals "1", the logic operations module 740 may not use PDIP4 in the calculation of NDIP4. More specifically, if the mask determined by bit map builder 730 equals "0", then the DIP4_ERR(0) calculation may be performed using the logic operation of (P3, P2, P1, P0,)^(A3, A2, A1, A0). The operation of (P3, P2, P1, P0)^(A3, A2, A1, A0) is read as the bits of P3, P2, P1, and P0 are XORed with the bits of A3, A2, A1, A0. Note that, if the incoming traffic of a, b, c, and d is the first cycle, PDIP may be set equal to "0." On the hand, if the mask equals "1", then the DIP4_ERR(0) calculation is performed using the terms (A3, A2, A1, A0).

In this example, since the 16-bits of a(15:0) contains "data," the check enable bit may be flagged as "0" and the mask may be set to equal "0" as shown in FIG. 10. Since the mask equals "0", then the logic operation of (P3, P2, P1, P0,)^(A3, A2, A1, A0) may be used to generate an output of (PA3, PA2, PA1, PA0). A NAND operation may be performed on (PA3, PA2, PA1, PA0), and the resultant is latched into a register (not shown) as DIP4_ERR(0). Since a(15:0) contains "data," the mask term and check enable term may be set to indicate that a DIP4 parity bit check will not be performed on this 16-bit portion of the data stream.

Note that, depending upon the mask, the calculation of (PA0, PA3, PA2, PA1) determined in STEP 1 may be used to calculate the subsequent DIP4_ERR(1) in STEP 2. In STEP 2, logic operations module 740 may inspect the 16-bits of b(15:0), which include "data." Therefore, the check enable may be set equal to "0" and, the mask data field of b(15:0) may be set equal to "0." Since the mask equals "0," logic operations module 740 may select the logic operation of (PA0, PA3, PA2, PA1)^(B3, B2, B1, B0). The logic operation of (PA0, PA3, PA2, PA)^(B3, B2, B1, B0) may generate an output of (PB3, PB2, PB1, PB0). A NAND operation is performed on (PB3, PB2, PB1, PB0), and the output is latched into a register (not shown) as DIP4_ERR (1).

In STEP 3 of FIG. 9, c(15:0) contains a "control word." Therefore, the map bit rules of FIG. 10 may be applied to c(15:0). According to the bit map rule in FIG. 10, the decoder 720 may determine the type of information which was stored in the previous 16-bits. In this example, the previous 16-bits was b(15:0), which contained "data." Since the previous 16-bits, b(15:0), contained "data" and the current input is a "control word," the bit map rules of FIG. 10 instructs logic operations module 740 to set the bit map as "chk_en=0, mask=0." Since the mask term for c(15:0) equals "0", the logic operations module 740 may select (PB0, PB3, PB2, PB)^(C3, C2, C1, C0) to generate the DIP4_ERR(2) calculation. The logic operation of (PB0, PB3, PB2, PB1)^(C3, C2, C1, C0) produces an output of (PC3, PC2, PC1, PC0). Logic operations module 740 then performs a NAND operation on (PC3, PC2, PC1, PC0) and latches the output into DIP4_ERR(2).

In STEP 4, d(15:0) contains a control word. As a result, the system may apply the bit map rules of FIG. 10. Therefore, the logic operations module 740 may examine the previous 16-bits to determine the type of input. In this example, the previous 16-bits was c(15:0), which contain a "control word." The rules of FIG. 10 serve as a key to instruct the program to set the check enable to equal "1" and the mask term equal to "1" since the previous input is "not data" and the current input includes a "control word." Based upon the mask term of the bit map, the program may then perform the bit map decision. Since the mask for d(15:0) equals "1", the system may select (D3, D2, D1, D0) to generate the DIP4_ERR3. The terms of (D3, D2, D1, D0) may also be set as NDIP4 (P3, P2, P1, P0). By selecting (D3, D2, D1, D0), this means that, in this example that the calculations of the intermediate terms DIP4_ERR indicate that previously calculated parity bits will not be used in calculating NDIP. Namely, the NDIP may be calculated, in this example, using the new input terms of D3, D2, D1 and D0 terms from the 16-variables transferred from D-flop 715. Logic operations module 740 then sets (D3, D2, D1, D0) equal to (P3, P2, P1, P0). Logic operations module 740 inputs (P3, P2, P1, P0) as a feedback into D-flop 715, as shown in FIG. 8. Then, the reiterative process of calculating NDIP may begin again.

The DIP4_ERR(i) from logic operations module 740 may be transmitted through a D-flop 750 to a DIP4 error checker 760. If the DIP4_ERR calculation performed by logic operations module 740 indicates that one of the 16-bit data includes a DIP4 error, DIP4 error checker 760 may generate a final DIP4_ERR. The invention may be configured so that DIP4 error checker 760 may check for an error only at the end of a payload data burst or individual control word (Idle control word or Training control word). The chk_en(i) transferred from the bit map builder 730 to DIP4 error checker 760 may function to indicate the 16-bit grouping within the data stream to check for an error. The following logic equation (Eq. 1) may be used to generate the final DIP4_ERR.

Final DIP4_ERR=DIP4_ERR(i)^chk_en(i)   Eq. 1

The final DIP4_ERR may be checked as follows: For example, in FIG. 4, in cycle C1, only one DIP-4 codeword may be checked because there is only one payload control word (PC) in cycle C1. The DIP4 error checker 760 may not perform a DIP4 error check in cycles C2, C4, C7 and C8, since these cycles only contain data. In cycle C3, DIP4 error checker 760 may check for one DIP-4 codeword because there is only one payload control word (PC) included in cycle C3. In cycle C5, DIP4 error checker 760 may check for two DIP-4 code words since cycle C5 contains two payload control words (PC). DIP4 error checker 760 will also check for two control words in cycle C6 since cycle C6 includes an idle control word (IC) and a payload control word (PC). In cycle C9, DIP4 error checker 760 will check for four DIP-4 code words since cycle C9 contains four idle control words (IC).

In general, the invention provides a method and apparatus for locating parity bits and determining whether an error has occurred within a misaligned data stream. Thus, the parity checker according to the invention may be used in the 16-bits data path of an interface of a SPI-4 chip.

One having ordinary skill in the art will readily understand that the steps of the method may be performed in different order, or with multiple steps in parallel with one another. Also, one having ordinary skill in the art will understand that a network device may be configured to perform the above-described method either in silicon or in software. Accordingly, one will understand that the switching configurations described herein are merely exemplary. Accordingly, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

I claim:

1. A logic circuit comprising:
   an interface configured to receive and transmit a data stream; and
   an error detection unit configured to detect an error detection code error when a misalignment occurs within said data stream by recursively calculating parity terms, wherein the data stream comprises at least one of a variable length burst and a fixed length burst and said error detection unit is configured to perform error detection on said data stream comprising a 64-bit input data bus and a 4-bit control bus.

2. The logic circuit as recited in claim 1, wherein said error detection unit is configured to assign said data stream to columns and rows within a parity calculation staging matrix;
   wherein said parity calculation staging matrix is configured to determine at least one parity bit within said data stream; and
   wherein said parity bit is configured to detect an error within said data stream.

3. The logic circuit as recited in claim 2, wherein said error detection unit recursively calculates the parity terms according to the equations:

$P(3)=D(3)\char`\^C(0)\char`\^B(1)\char`\^A(2)$ $P(2)=D(2)\char`\^C(3)\char`\^B(0)\char`\^A(1)$ $P(1)=D(1)\char`\^C(2)\char`\^B(3)\char`\^A(0)$ $P(0)=D(0)\char`\^C(1)\char`\^B(2)\char`\^A(3)$ where the "P-terms" are the parity terms and comprise four bits and where "A", "B", "C", and "D" are variables representing a 16-bit input calculated by said logic circuit.

4. The logic circuit as recited in claim 3, wherein said error detection unit calculates an intermediate term to determine a feedback loop value used to determine a next parity bit.

5. The logic circuit as recited in claim 4, wherein said error detection unit utilizes said intermediate term to determine said recursive terms input into said feedback loop to calculate said next parity bit.

6. The logic circuit as recited in claim 5, wherein said error detection unit utilizes a previous parity bit as a feedback loop value to determine a next intermediate term parity bit.

7. The logic circuit as recited in claim 6, wherein said error detection unit is configured to generate a bit map having at least two data fields, wherein said bit map is configured to indicate a location within said data stream to check for said parity bit.

8. The logic circuit as recited in claim 7, wherein said bit map includes a mask configured to detect a classification of a current input of said data stream and a previous input of said data stream; and
   wherein said bit map determines said next intermediate term parity bit based upon said classification of the current input and a previous input.

9. The logic circuit as recited in claim 8, wherein said error detection unit utilizes said previous parity bit and said current input to determine said next intermediate term parity bit based upon a first data classification and a second data classification.

10. The logic circuit as recited in claim 9, wherein said data stream comprises variable length bursts.

11. A method of error detection within a logic circuit, said method comprising:
    interfacing a first device having a first transfer rate with a second device having a second transfer rate;
    receiving a data stream;
    calculating a parity bit within said data stream;
    calculating an intermediate term to determine a feedback loop value used to determine a next intermediate term parity bit;
    detecting an error detection code to detect an error within said data stream; and
    recursively calculating parity terms.

12. The method as recited in claim 11, further comprising the step of:
    filling a parity calculation staging matrix.

13. The method as recited in claim 12, further comprising the step of:

recursively calculating the parity terms according to the equations:

$$P(3)=D(3)\hat{}C(0)\hat{}B(1)\hat{}A(2)$$

$$P(2)=D(2)\hat{}C(3)\hat{}B(0)\hat{}A(1)$$

$$P(1)=D(1)\hat{}C(2)\hat{}B(3)\hat{}A(0)$$

$$P(0)=D(0)\hat{}C(1)\hat{}B(2)\hat{}A(3)$$

where the "P-terms" are the parity terms and comprise four bits and where "A" "B", "C" and "D" are variables terms representing a 16-bit input calculated by said logic circuit.

14. The method as recited in claim 13, further comprising the step of:

utilizing said intermediate term to determine said recursively calculated parity terms input into said feedback loop to calculate said next parity bit.

15. The method as recited in claim 14, further comprising the step of:

receiving variable length bursts into said interface.

16. A logic circuit comprising:

an interface means for receiving and transmitting a data stream; and an error detection means for detecting an error detection code error by recursively calculating a parity term, wherein the data stream comprises at least one of a variable length burst or a fixed length burst and said error detection means is configured to perform error detection on said data stream comprising a 64-bit input data bus and a 4-bit control bus.

17. The logic circuit as recited in claim 16, wherein said error detection means recursively calculates the parity terms according to the equations:

$$P(3)=D(3)\hat{}C(0)\hat{}B(1)\hat{}A(2)$$

$$P(2)=D(2)\hat{}C(3)\hat{}B(0)\hat{}A(1)$$

$$P(1)=D(1)\hat{}C(2)\hat{}B(3)\hat{}A(0)$$

$$P(0)=D(0)\hat{}C(1)\hat{}B(2)\hat{}A(3)$$

where the "P-terms" are the parity terms and comprise four bits and where "A", "B", "C", and "D" are variables terms representing a 16-bit input calculated by said logic circuit.

18. The logic circuit as recited in claim 17, wherein said error detection means calculates an intermediate term to determine a feedback loop value used to determine a next parity bit.

19. The logic circuit as recited in claim 18, wherein said error detection means utilizes said intermediate term to determine said recursively calculated parity terms input into said feedback loop to calculate said next parity bit.

20. The logic circuit as recited in claim 19, wherein said error detection means utilizes a previous parity bit as a feedback loop value to determine a next intermediate term parity bit.

* * * * *